United States Patent
Sachdev et al.

(10) Patent No.: US 8,488,403 B2
(45) Date of Patent: Jul. 16, 2013

(54) SENSE-AMPLIFICATION WITH OFFSET CANCELLATION FOR STATIC RANDOM ACCESS MEMORIES

(76) Inventors: Manoj Sachdev, Waterloo (CA); Mohammad Sharifkhani, Tehran (IR); Jaspal Singh Shah, Waterloo (CA); David Rennie, Waterloo (CA)

(*) Notice: Subject to any disclaimer, the term of this patent is extended or adjusted under 35 U.S.C. 154(b) by 0 days.

(21) Appl. No.: 12/757,033

(22) Filed: Apr. 8, 2010

(65) Prior Publication Data

US 2011/0255359 A1    Oct. 20, 2011

Related U.S. Application Data

(60) Provisional application No. 61/202,805, filed on Apr. 8, 2009.

(51) Int. Cl.
   *G11C 7/02*    (2006.01)
(52) U.S. Cl.
   USPC ............................................. 365/207

(58) Field of Classification Search
   USPC ............................................. 365/207
   See application file for complete search history.

(56) References Cited

U.S. PATENT DOCUMENTS

| | | | | |
|---|---|---|---|---|
| 6,396,329 | B1 * | 5/2002 | Zerbe | 327/336 |
| 7,460,387 | B2 * | 12/2008 | Matick et al. | 365/63 |
| 7,859,436 | B2 * | 12/2010 | Werner et al. | 341/89 |
| 2009/0073777 | A1 * | 3/2009 | Jung et al. | 365/189.05 |
| 2010/0019804 | A1 * | 1/2010 | Jung et al. | 327/52 |

* cited by examiner

*Primary Examiner* — Hoai V Ho
*Assistant Examiner* — Pablo Huerta

(57) ABSTRACT

An offset cancellation scheme for sense amplification is described. The scheme consists of group of transistors which are selectively coupled to high and low voltage levels via multi-phase timing. This results in a voltage level on sensing nodes of interest which are a function of transistor mismatch. The resulting voltage levels act to compensates for the transistor mismatch, thereby improving the reliability of the sense amplifier in the presence of process non-idealities. The offset cancellation scheme is applicable to numerous types of sense amplifiers, amplifiers, and comparators.

15 Claims, 16 Drawing Sheets

SENSE-AMPLIFICATION WITH OFFSET CANCELLATION FOR STATIC RANDOM ACCESS MEMORIES

An offset cancellation scheme for sense amplification is described. The offset cancellation scheme is applicable to numerous types of sense amplifiers and is enabled with a multi-phase timing scheme. This application claims the benefit of priority of U.S. Provisional Patent Application No. 61/202,805 filed Apr. 8, 2009 which is incorporated herein by reference in its entirety.

BACKGROUND OF THE INVENTION

Embedded memories are critical blocks in modern system-on-chip (SOC) integrated circuit. On many modern integrated circuits embedded memory arrays consume more than half of the die area. The penalty in terms of latency resulting from an off-chip memory access makes it desirable to include on-chip caches which are as large as possible. As CMOS technology scale deep into the nanometric regime the density of bitcells has significantly increased, resulting in much larger embedded memory for the same die area.

While embedded memories are important performance enablers, they come with many challenges. The difficulties in integrating large, dense embedded memories are primarily related to manufacturing. The scaling of CMOS has brought with it an increase in the process variability which designers must contend with. While variability used to be primarily systematic, as feature sizes scale below 100 nm random variability has become increasingly problematic. Systematic variability causes circuits to vary from die to die or wafer to wafer, while random variability can cause variations in the properties of adjacent transistors. There are numerous causes of random variability, including sub-wavelength lithography, random dopant fluctuations, line edge roughness and negative bias temperature instability (NBTI). Increasingly large embedded memories are being integrated into ICs, and as such the variability over the entire array can be very large. If sufficiently large design margins are not used in the design phase, variability can result in failures.

An SRAM array consists of a number of SRAM bitcells which are organized in multiple rows and columns in a plurality of blocks, as shown in FIG. 1. Each bitcell stores one bit of data; a logic value of zero or one. A bitcell usually has a control terminal wordline and a pair of data terminal called bitlines. During the read operation, the wordline becomes active and the cell draws a current from either one of the bitlines depending on the logic value stored in the cell. Voltage or current sense amplifiers are used to sense which one of the bitlines are affected by the cell current to detect the logic value that is stored in the cell. In order to save area, the sense amplifiers may be shared among a plurality of columns through multiplexer switches.

Sense amplifiers are important peripheral circuits in an SRAM array. Sense amplifiers are intrinsically amplifiers, and as such they operate by taking an input signal and amplifying it. In the case of a sense amplifier the goal is to take the differential signals which exist on the bitlines and output a full-swing signal which represents the state of the selected bitcell. If the amplifier has an intrinsic offset due to process variability then the size of the input signal will need to be large enough to compensate for that offset, or else an incorrect decision will be made. Transistor mismatch in the symmetric circuits that construct a sense amplifier play a key role in the creation of static offset for the sense amplifier.

SUMMARY OF THE INVENTION

A sense amplifier scheme which allows for the compensation of offsets. Compensating for offsets in sense amplifier circuits offers higher sensitivity to the SRAM cell current. Hence, the sense amplifier scheme allows for a shorter cell access time which results in a higher data stability and faster operation.

In accordance with one aspect of the present invention there is provided a pair of nodes connected to a pair of transistors. Also provided are a pair of levels, one high and one low. The nodes are precharged to an identical initial level. The nodes are connected to the complementary level through the pair of transistors such that the new level on the nodes will be a function of any difference between the pair of transistors.

The SRAM read operation takes place and the difference in the levels on the pair of nodes acts against to compensate for the intrinsic offset in the sense amplifier.

In accordance with an aspect of the present invention there is provided a . . .

BRIEF DESCRIPTION OF THE DRAWINGS

An embodiment of the present invention will now be described by way of example only with reference to the following drawings in which.

DETAILED DESCRIPTION OF THE PREFERRED EMBODIMENTS

For convenience, like structures in drawings will be referenced by like numerals in the description. In the present embodiment, the preferred high voltage level is VDD and the preferred low voltage level is around.

Figure 1:
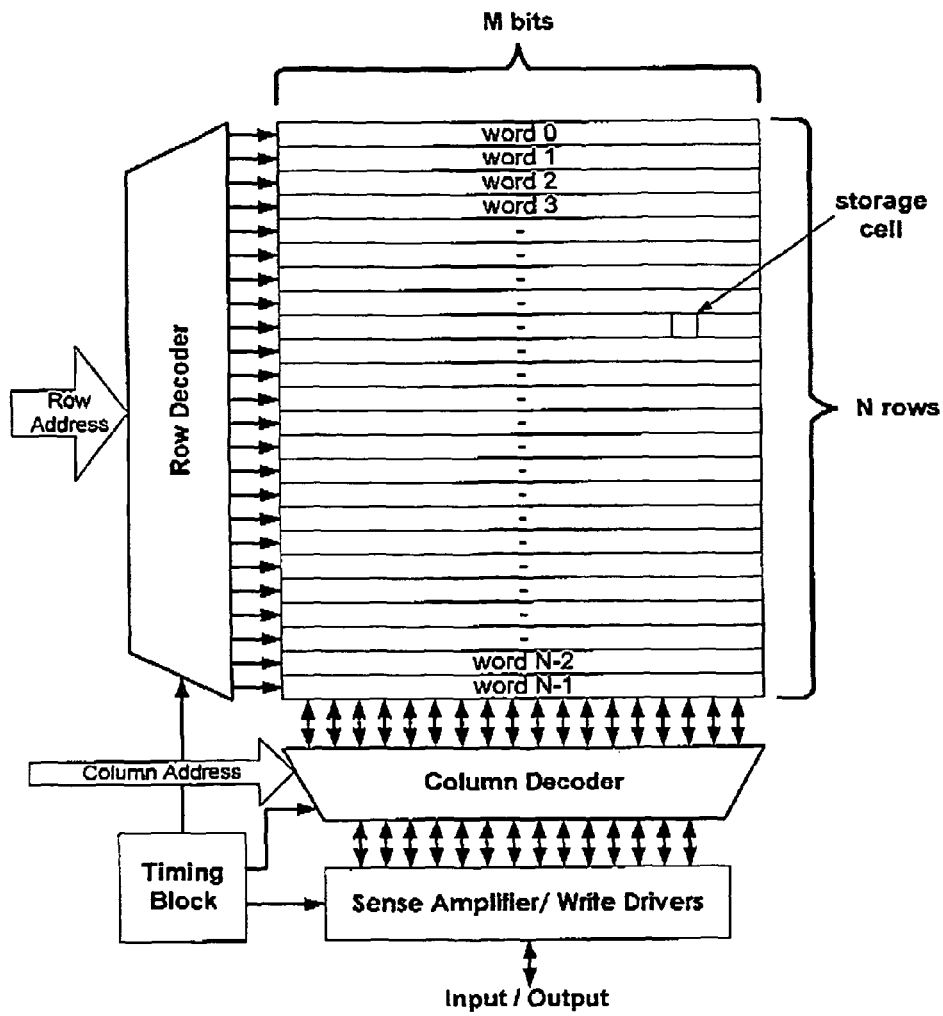
FIG. 1 shows a typical SRAM architecture (the prior art)
Figure 2:
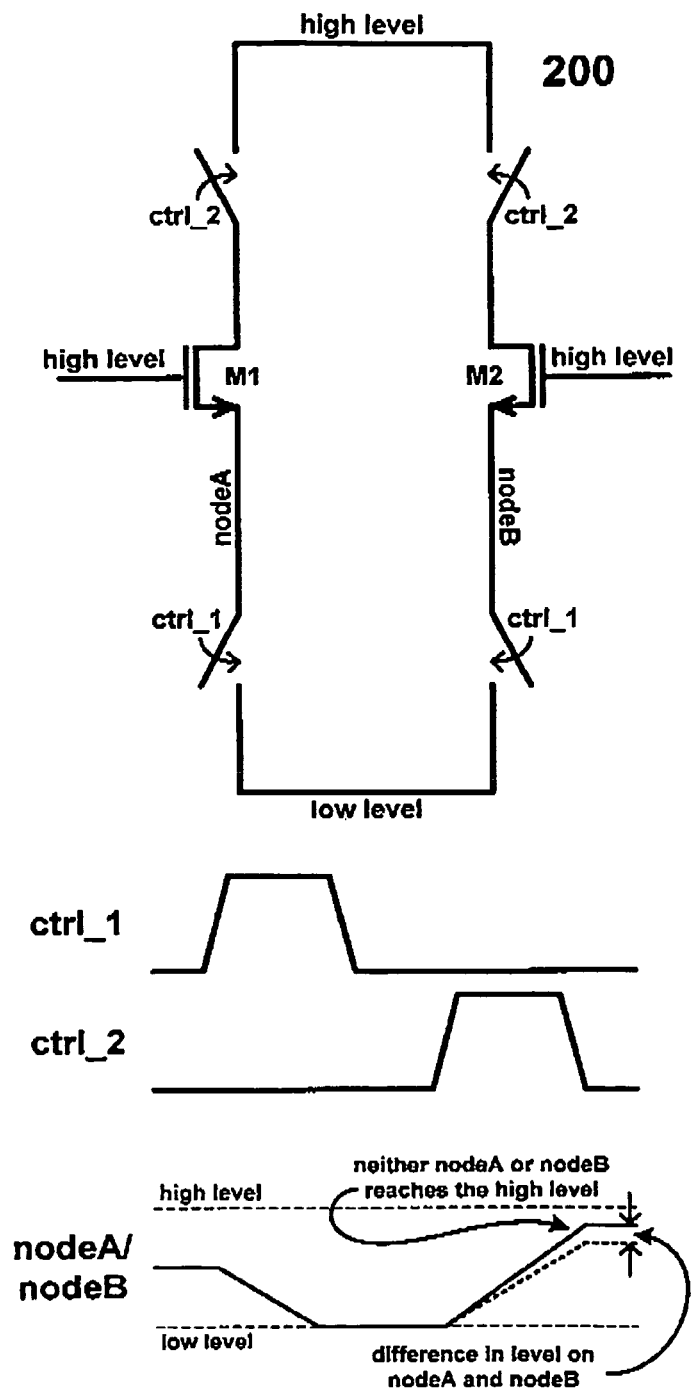
FIG. 2 shows an embodiment of a proposed scheme for offset cancellation.

FIG. 2 illustrates the invention by way of a circuit diagram and associated waveforms to illustrate the operation of the scheme. The transistors of interest are NMOS transistors labelled M1 and M2. As the voltage at the gate of these transistors is at a high voltage level the transistors are considered to be on. When signal ctrl_1 is activated the associated switches close and the nodes nodeA and nodeB are connected to the low voltage level. When signal ctrl_2 is activated the associated switches close and the nodes nodeA and nodeB are connected to the high voltage level through the NMOS transistors M1 and M2. An NMOS transistor is not able to fully pass a high voltage level, and as such the final voltage on the nodes nodeA and nodeB are less than the high voltage level. Moreover the final voltages level on nodeA will be a function of the transistor M1 and the final voltage level on nodeB will be a function of the transistor M2.

As an example, if the threshold voltage of transistor M1 is higher than the threshold voltage of transistor M2, the final voltage on nodeA will be less than the final voltage on nodeB. The difference in the voltage level on nodeA compared with nodeB will be proportional to the difference in the threshold voltage between transistors M1 and M2.

Figure 3:
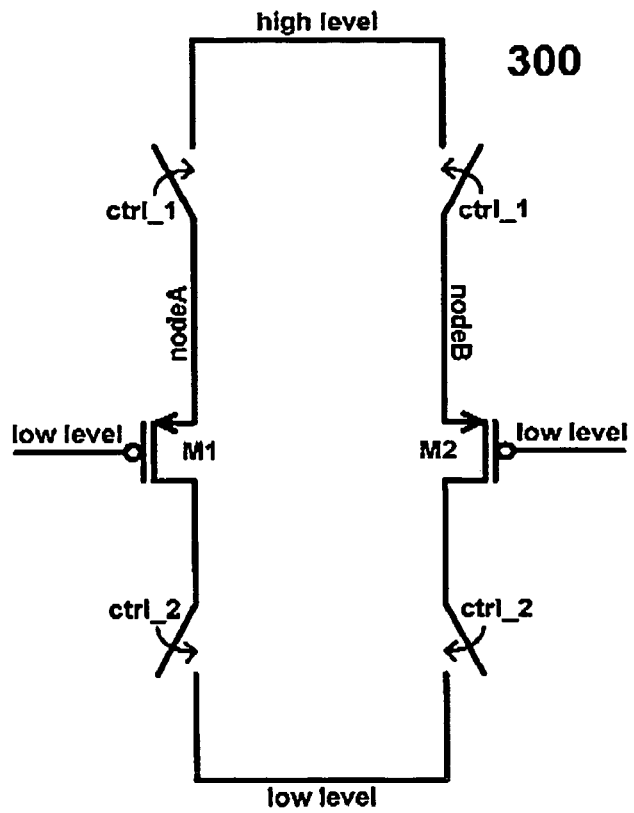
FIG. 3 shows another embodiment of a proposed scheme for offset cancellation.
Figure 3:
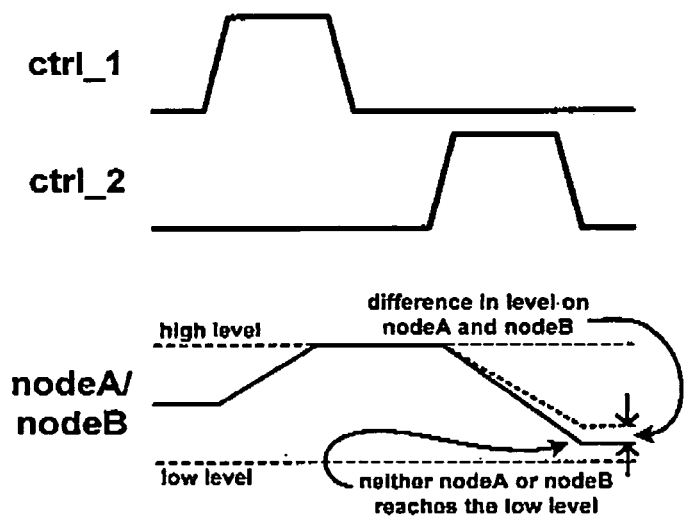

FIG. 3 illustrates the invention by way of a circuit diagram and associated waveforms to illustrate the operation of the scheme. The transistors of interest are PMOS transistors labelled M1 and M2. As the voltage at the gate of these transistors is at a low voltage level the transistors are considered to be on. When signal ctrl_1 is activated the associated switches close and the nodes nodeA and nodeB are connected to the high voltage level. When signal ctrl_2 is activated the associated switches close and the nodes nodeA and nodeB are connected to the low voltage level through the PMOS transistors M1 and M2. A PMOS transistor is not able to fully pass a low voltage level, and as such the final voltages on the nodes nodeA and nodeB are higher than the low voltage level. Moreover, the final voltage level on nodeA will be a function of the transistor M1 and the final voltage level on nodeB will be a function of the transistor M2.

As an example, if the threshold voltage of transistor M1 is higher than the threshold voltage of transistor M2, the final voltage on nodeA will be higher than the final voltage on nodeB. The difference in the voltage level on nodeA compared with nodeB will be proportional to the difference in the threshold voltage between transistors M1 and M2.

The invention can be applied to various sense amplifier architectures. To illustrate the implementation of this scheme several embodiments are provided using both current sense amplifier architectures and voltage sense amplifier architectures.

Figure 4:
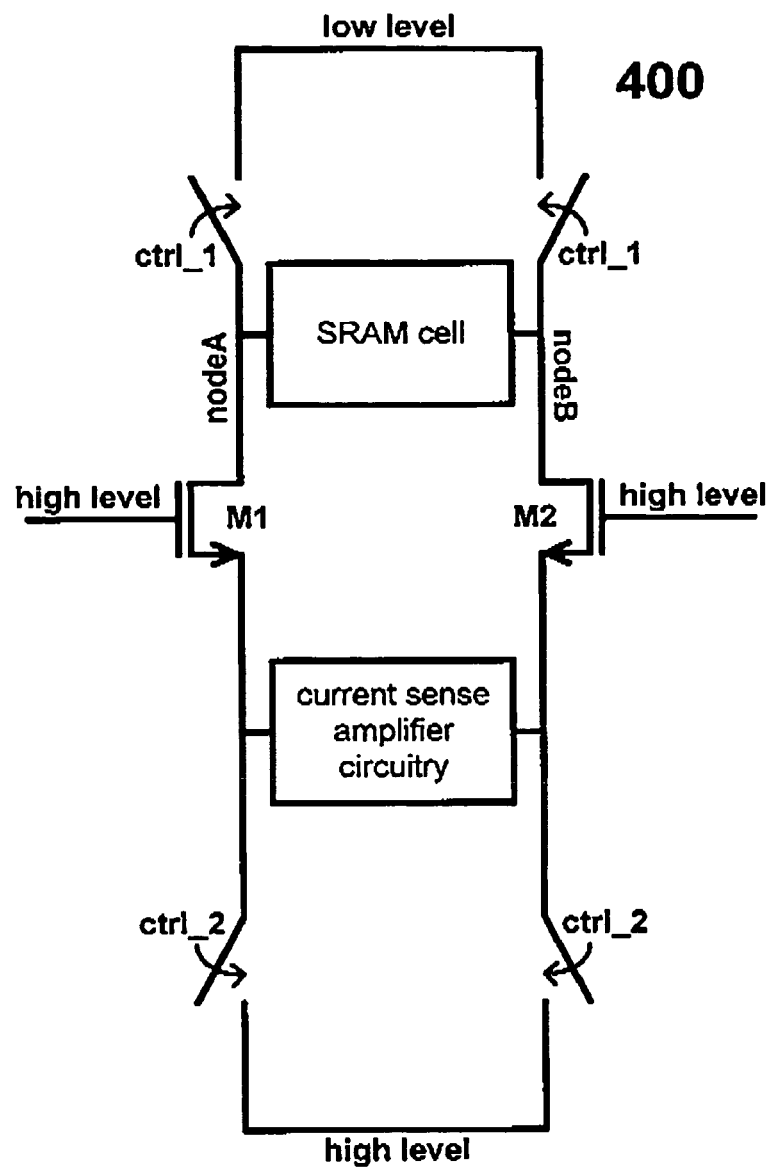
FIG. 4 shows how the proposed scheme will be connected to an SRAM column.

FIG. 4 depicts a conceptual diagram showing one possible embodiment of the invention where the offset cancellation scheme is utilized in conjunction with a current sense amplifier. The transistors of interest as labelled M1 and M2. In this scheme, the transistors of interest also function as multiplexing transistors. This is a current sense amplifier as the sense amplifier senses the current through the transistors M1 and M2. When the signal ctrl_1 is enabled the nodes nodeA and nodeB are connected to a low voltage level. When the signal ctrl_2 is enabled the nodes nodeA and nodeB are connected to a high voltage level through the NMOS transistors M1 and M2. After this the read operation begins with an SRAM cell being enabled via a control signal such as the wordline enable.

Figure 5:
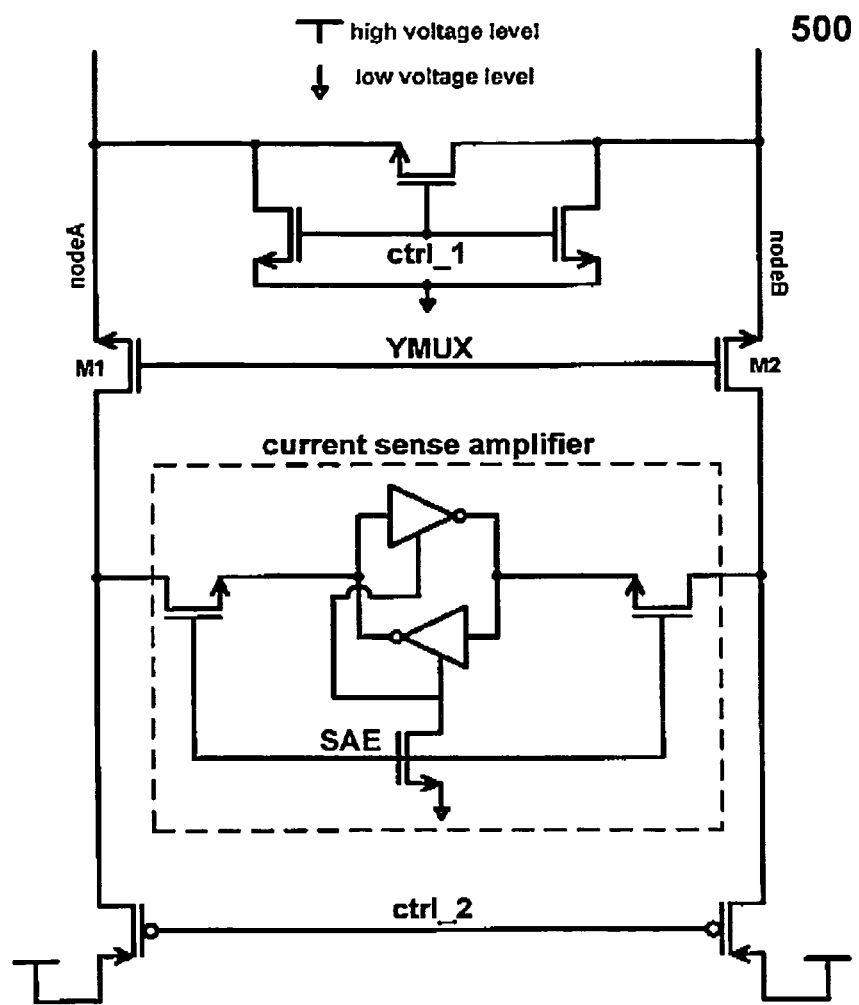
FIG. 5 shows an embodiment connecting the proposed scheme to an SRAM column pre-charge circuit.

FIG. 5 is a circuit diagram showing the details of the embodiment 400. In this configuration the nodes nodeA and nodeB are commonly referred to as bitlines.

Figure 6:
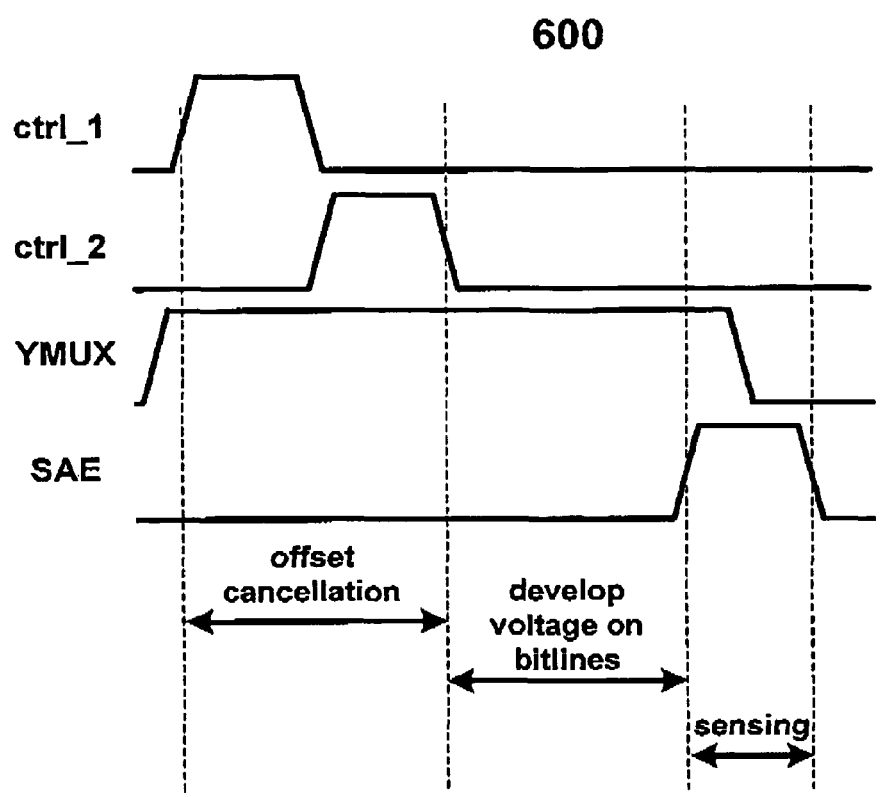
FIG. 6 shows a typical timing scheme associated with the proposed scheme shown in FIG. 5.

FIG. 6 shows the associated waveforms for the embodiment 400. During the read operation the bitlines develop a differential voltage. After a period of time the sense amplifier is enabled via a control signal SAE. Once the signal SAE is enabled the current sense amplifier turns on and amplifies the differential voltage on the bitlines to full swing.

Figure 7:
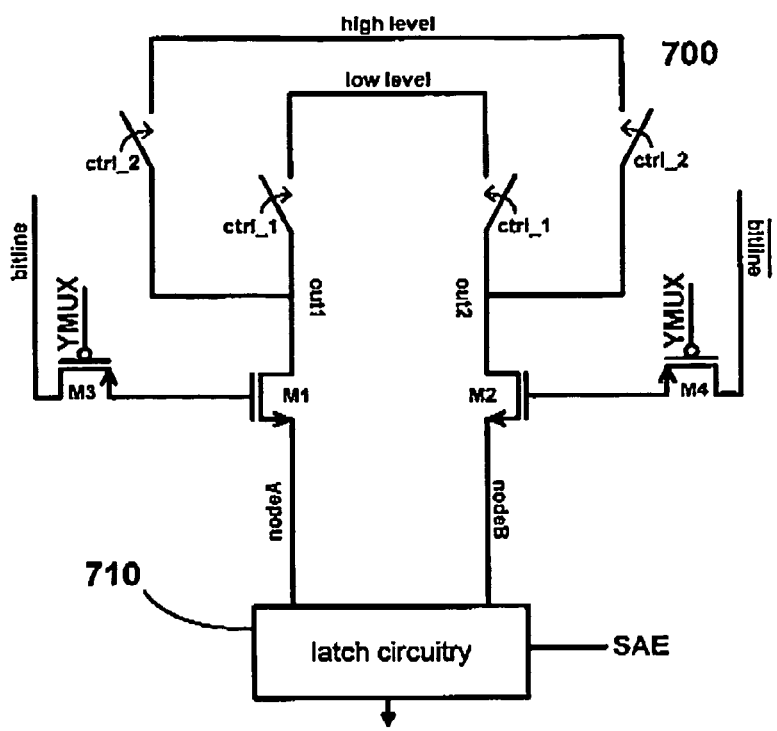
FIG. 7 shows another embodiment of a sense amplifier with the proposed scheme.

FIG. 7 is a conceptual diagram showing one possible implementation where the offset cancellation scheme is utilized in conjunction with a voltage sense amplifier. The transistors of interest as labelled M1 and M2 and in this embodiment are NMOS transistors. This is a voltage sense amplifier as the sense amplifier senses the voltage at the gates of the transistors M1 and M2. During the offset cancellation stage the input to the transistors M1 and M2 is held at a high voltage level in order that they remain on. During the offset cancellation stage the transistors M3 and M4 are off in order to isolate the sense amplifier from the bitlines. When the signal ctrl_1 is enabled the nodes nodeA and nodeB are connected to a low voltage level through the transistors M1 and M2. M1 and M2 are NMOS transistors and as such nodes nodeA and nodeB are able to reach the low voltage level. When the signal ctrl_2 is enabled the nodes nodeA and nodeB are connected to a high voltage level through the NMOS transistors M1 and M2. After this the transistors M1 and M2 will be connected to the SRAM cell via multiplexing transistors M3 and M4 using control signal YMUX and the latch circuitry is enabled by activation of the SAE signal.

Figure 8:
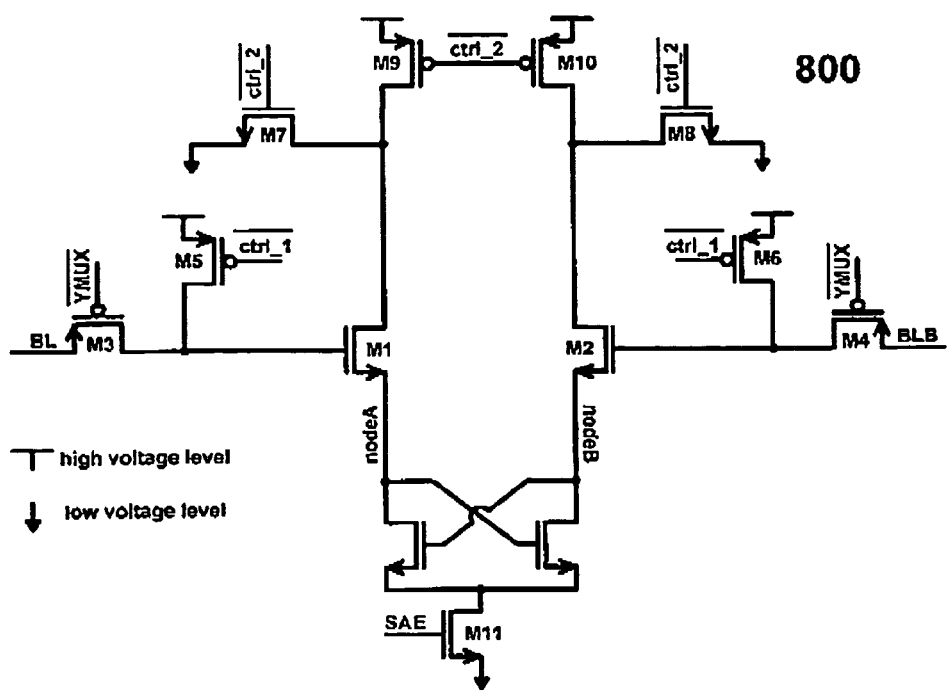
FIG. 8 shows an embodiment showing circuit implementation details of the proposed scheme shown in FIG. 7.

FIG. 8 depicts a circuit diagram showing one embodiment of the scheme 700 and it is denoted by the number 800. In this configuration the nodes nodeA and nodeB are also the output nodes of the sense amplifier. Transistors M3 and M4 are multiplexing transistors which connect the sense amplifier to the SRAM cell via complementary signals known as bitlines (BL and BLB).

The gates of the NMOS transistors M1 and M2 need to remain at a high voltage level during the offset cancellation stage. The signal ctrl_1 is used to control the voltage level at the gates of transistors M1 and M2. During the offset cancellation stage the signal ctrl_1 is low and the input signals to the transistors M1 and M2 are held at a high voltage level via transistors M5 and M6. Moreover, the signal YMUX is kept high thus transistors M3 and M4 are off, blocking the signals BL and BLB. Subsequently, first the signal ctrl_2 is enabled to high level. It turns on transistors M7 and M8, thus connecting nodes nodeA and nodeB to a low voltage level through transistors M1 and M2. As transistors M1 and M2 are NMOS transistors, nodes nodeA and nodeB are able to fully reach the low voltage level. Next, the signal ctrl_2 is makes high to low transition. It turns off transistors M7 and M8 and turns on transistors M9 and M10. With transistors M9 and M10 on, nodes nodeA and nodeB are connected to a high voltage level through transistors M1 and M2. As transistors M1 and M2 are NMOS transistors, nodes nodeA and nodeB are unable to fully reach the high voltage level. Moreover, when signal ctrl_2 is high, the final voltage level on nodeA will be a function of the threshold voltage of transistor M1 and the voltage level on nodeB will be a function of the threshold voltage of transistor M2.

Offset cancellation stage is completed when the signal ctrl_1 makes a low to high transition turning off transistors M5 and M6. Subsequently, signal YMUX is enabled which connects the signals BL and BLB to the transistors M1 and M2. Next the sense amplification stage begins when the signal SAE is enabled, turning on transistor M11 which activates the latching operation in the sense amplifier.

Figure 9:
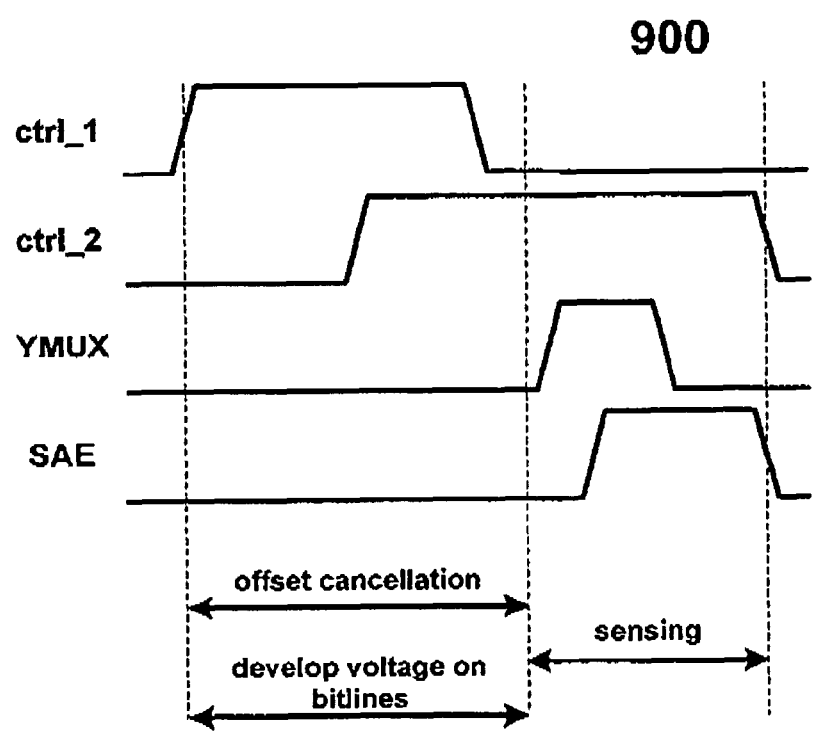
FIG. 9 shows a typical timing scheme associated with the proposed scheme shown in FIG. 8.

FIG. 9 shows the associated waveforms for the embodiment 800. After the offset cancellation stage completes the bitlines develop a differential voltage. The bitlines are isolated from the sense amplifier until the signal YMUX is enabled. Once the signal SAE is enabled the voltage sense amplifier turns on and amplifies the differential voltage on the bitlines to full swing.

Figure 10:
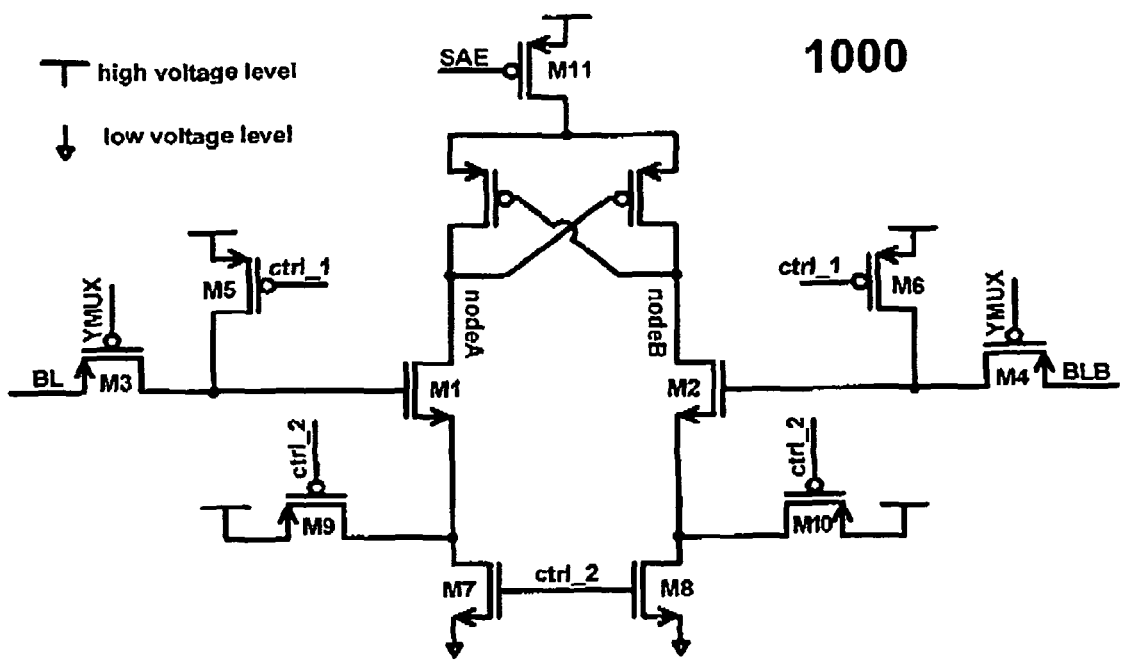
FIG. 10 shows another embodiment showing circuit implementation details of the proposed scheme shown in FIG. 7.

FIG. 10 is a circuit diagram showing a second embodiment of the scheme 700 and it is denoted by the number 1000. In this configuration the nodes nodeA and nodeB are also the output nodes of the sense amplifier. Transistors M3 and M4 are multiplexing transistors which connect the sense amplifier to the SRAM cells via complementary signals known as bitlines (BL and BLB).

The gates of the NMOS transistors M1 and M2 need to remain at a high voltage level during the offset cancellation stage. The signal ctrl_1 is used to control the voltage level at the gates of transistors M1 and M2. During the offset cancellation stage, the signal ctrl_1 is kept low and the input signals to the transistors M1 and M2 are held at a high voltage level via transistors M5 and M6. Moreover, the signal YMUX is low thus transistors M3 and M4 are off, blocking the signals BL and BLB. During the offset cancellation stage first the signal ctrl_1 is kept low. Subsequently, transistors M7 and M8 are turned on by activating ctrl_2 signal to a high level, thus connecting nodes nodeA and nodeB to a low voltage level through transistors M1 and M2. As transistors M1 and M2 are NMOS transistors nodes nodeA and nodeB are able to fully reach the low voltage level. Next, the signal ctrl_2 makes a high level to low level transition. It turns off transistors M7 and M8 and turns on transistors M9 and M10. With transistors M9 and M10 on, nodes nodeA and nodeB are connected to a high voltage level through transistors M1 and M2. As transistors M1 and M2 are NMOS transistors, nodes nodeA and nodeB are unable to fully reach the high voltage level while ctrl_2 is at the low level. The final voltage level on nodeA will be a function of the threshold voltage of the transistor M1 and the voltage level on nodeB will be a function of the threshold voltage of the transistor M2.

Offset cancellation stage is completed when ctrl_1 signal makes low to high transition turning off transistors M5 and M6. Subsequently, signal YMUX is enabled which connects the signals BL and BLB to the transistors M1 and M2. Next, the sense amplification stage begins the signal SAE makes a high level to low level transition turning on transistor M11 which activates the latching operation in the sense amplifier.

Figure 11:
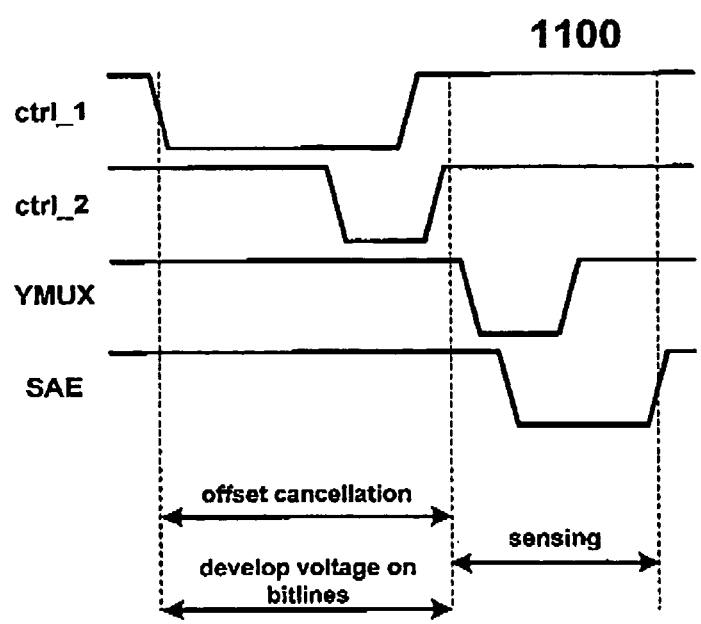
FIG. 11 shows a typical timing scheme associated with the proposed scheme shown in FIG. 10.

The FIG. 11 illustrates the associated waveform with the embodiment 1000. The figure highlights that the sense amplifier offset cancellation occurs while BL and BLB voltage difference development is occurring; hence it does not need extra time. In other words, the speed of the SRAM is not compromised.

Figure 12:
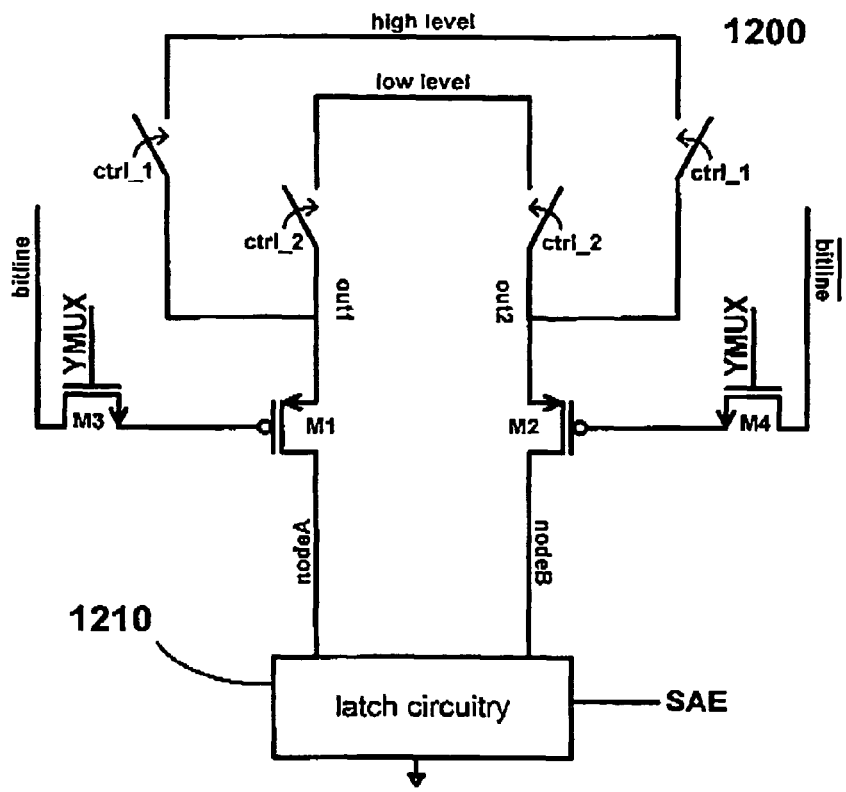
FIG. 12 shows yet another embodiment showing a sense amplifier with proposed offset cancellation scheme.

FIG. 12 is a conceptual diagram denoted by the number 1200 showing one possible implementation where the transistors of interest as are PMOS and labelled as M1 and M2. During the offset cancellation stage the input to the transistors M1 and M2 is held at a low voltage level in order to keep them on. Moreover, during the offset cancellation stage, the transistors M3 and M4 are kept off by deactivating the YMUX signal, in order to isolate the sense amplifier from the bitlines. When the signal ctrl_1 is enabled, the nodes nodeA and nodeB are connected to a high voltage level through the transistors M1 and M2. M1 and M2 are PMOS transistors and as such nodes nodeA and nodeB are able to reach the high voltage level. When the signal ctrl_2 is enabled the nodes nodeA and nodeB are connected to a low voltage level through the PMOS transistors M1 and M2. As transistors M1 and M2 are PMOS transistors, nodes nodeA and nodeB are unable to fully reach the low voltage level. Moreover, when signal ctrl_2 is disabled the voltage level on nodeA will be a function of the threshold voltage of the transistor M1 and the voltage level on nodeB will be a function of the threshold voltage of the transistor M2. Offset cancellation stage is completed when signal YMUX is enabled which connects the signals BL and BLB to the transistors M1 and M2. Next, the sense amplification stage begins the signal SAE is enabled, turning on transistor M11 which activates the latching operation in the sense amplifier.

Figure 13:
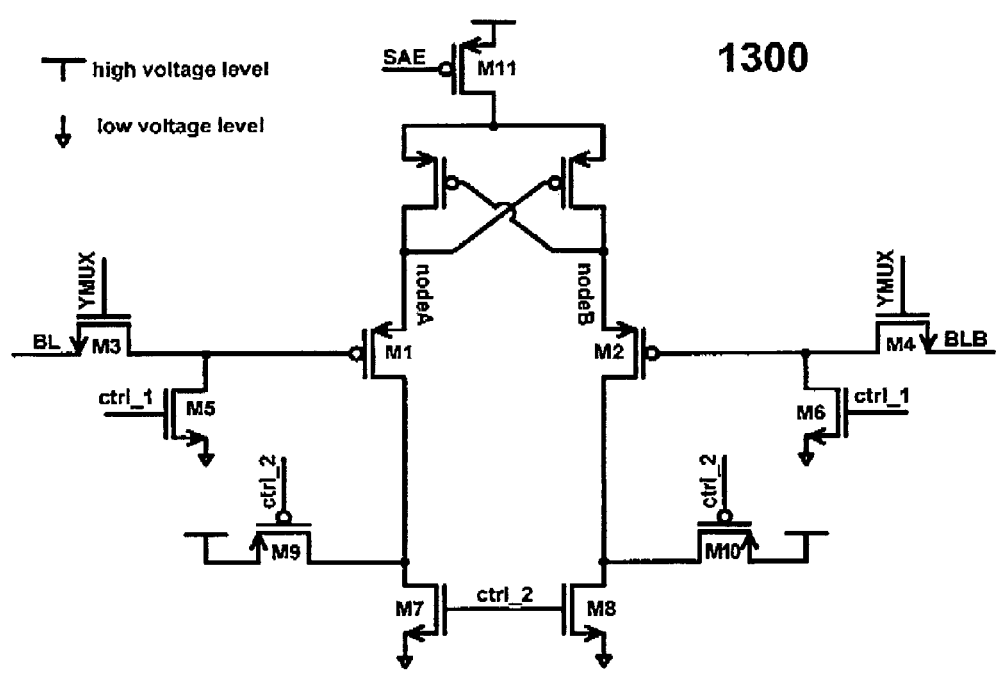
FIG. 13 shows an embodiment showing circuit implementation details of the proposed sense amplifier shown in FIG. 12.
Figure 14:
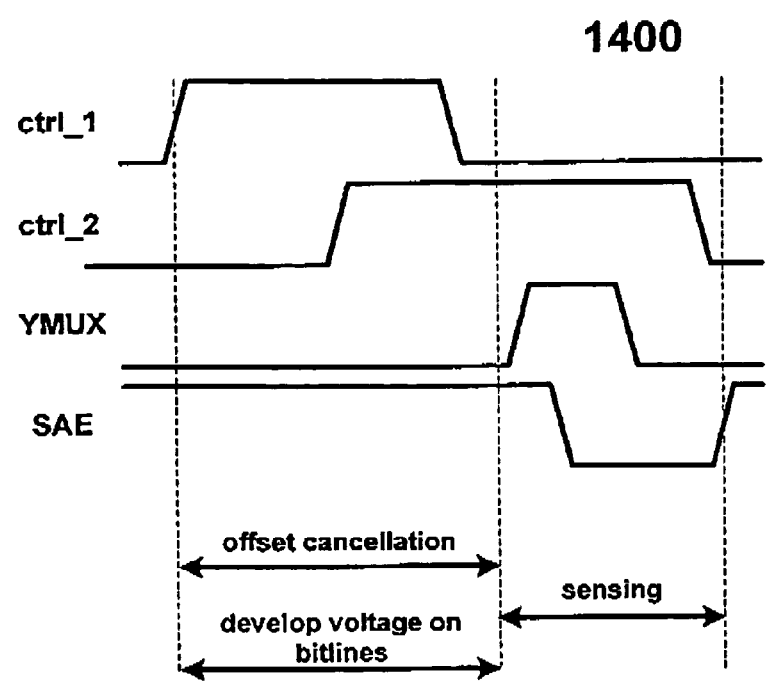
FIG. 14 shows a typical timing scheme associated with the sense amplifier circuit shown in FIG. 13.

FIG. 13 is a circuit diagram showing one embodiment of the scheme 1200 and it is denoted by the number 1300. In this configuration the nodes nodeA and nodeB are also the output nodes of the sense amplifier. Transistors M3 and M4 are multiplexing transistors which connect the sense amplifier to the SRAM cells via complementary signals known as bitlines (BL and BLB).

The gates of the PMOS transistors M1 and M2 need to remain at a low voltage level during the offset cancellation stage. The ctrl_1 signal is used to control the voltage level at the gates of transistors M1 and M2. During the offset cancellation stage the signal ctrl_1 is low and the input signals to the transistors M1 and M2 are held at a low voltage level via transistors M5 and M6. Moreover, the signal YMUX is low thus transistors M3 and M4 are off, blocking the signals BL and BLB. Initially, the signal ctrl_2 is kept at low level. It turns on transistors M9 and M10, thus connecting nodes nodeA and nodeB to a high voltage level through transistors M1 and M2. As transistors M1 and M2 are PMOS transistors, nodes nodeA and nodeB are able to fully reach the high voltage level. Next the signal ctrl_2 makes low level to high level transition. It turns off transistors M9 and M10 and turns on transistors M7 and M8. With transistors M1 and M2 are on, nodes nodeA and nodeB are connected to a low voltage level through transistors M1 and M2. As transistors M1 and M2 are PMOS transistors, nodes nodeA and nodeB are unable to fully reach the low voltage level. Moreover, the final voltage level on nodeA will be a function of the threshold voltage of transistor M1 and the voltage level on nodeB will be the function of the threshold voltage of transistor M2.

Offset cancellation stage is completed when ctrl_1 makes a high level to low level transition turning off transistors M5 and M6. Next the sense amplification stage begins the signal YMUX is enabled to the high level, turning on transistors M3 and M4. This connects the signals BL and BLB to the transistors M1 and M2. Finally, the SAE signal is activated to the low level, turning on transistor M11 which activates the latching operation in the sense amplifier circuitry. The FIG. 1400 depicts the timing waveforms associated with the embodiment 1300.

Figure 15:
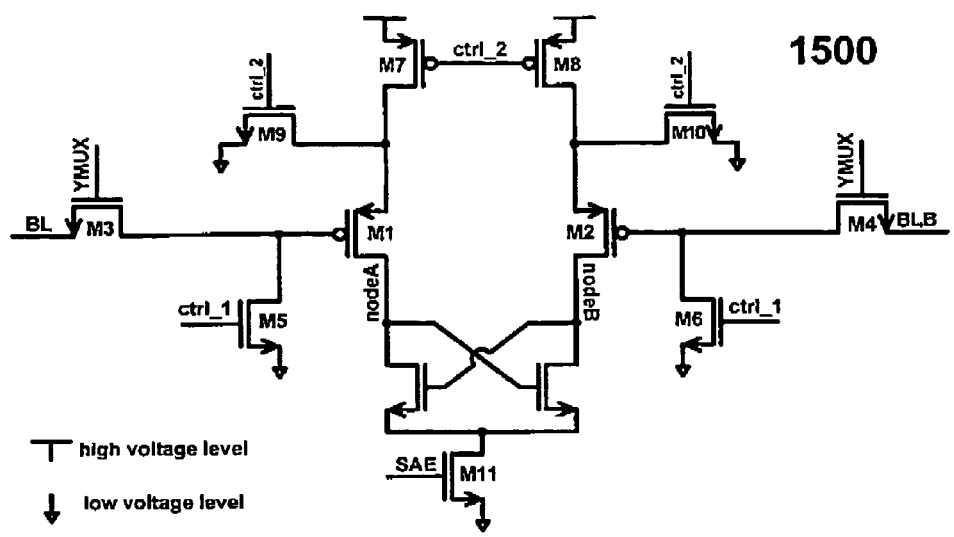
FIG. 15 shows yet another embodiment showing circuit implementation details of the proposed sense amplifier shown in FIG. 12.

FIG. 15 is a circuit diagram showing an embodiment of the scheme 1200 and it is denoted by the number 1500. In this configuration the nodes nodeA and nodeB are also the output nodes of the sense amplifier. Transistors M3 and M4 are multiplexing transistors which connect the sense amplifier to the SRAM cells via complementary signals known as bitlines (BL and BLB).

The gates of the PMOS transistors M1 and M2 need to remain at a low voltage level during the offset cancellation stage. The signal ctrl_1 is used to control the voltage level at the gates of transistors M1 and M2. During the offset cancellation stage the signal ctrl_1 is kept at high level and the input signals to the transistors M1 and M2 are held at a low voltage level via transistors M5 and M6. Moreover, the signal YMUX is kept at low level thus transistors M3 and M4 are off, blocking the signals BL and BLB. During the offset cancellation stage, first the signal ctrl_2 is kept at low level. It turns on transistors M7 and M8, thus connecting nodes nodeA and nodeB to a high voltage level through transistors M1 and M2. As transistors M1 and M2 are PMOS transistors, nodes nodeA and nodeB are able to fully reach the high voltage level. Next the signal ctrl_2 is enabled to high level. It turns off transistors M7 and M8 and turns on transistors M9 and M10. With transistors M9 and M10 on, nodes nodeA and nodeB are connected to a low voltage level through transistors M1 and M2. As transistors M1 and M2 are PMOS transistors, nodes nodeA and nodeB are unable to fully reach the low voltage level. Next, signal ctrl_1 is activated to the low level which disconnects the transistors M5 and M6. However, the gates of transistors M1 and M2 is in high impedance and are at low level which keeps transistors M1 and M2 on. At this time, the low voltage level at nodeA is a function of the threshold voltage of transistor M1 and the low voltage level at the nodeB is a function of the threshold voltage of transistor M2.

Figure 16:
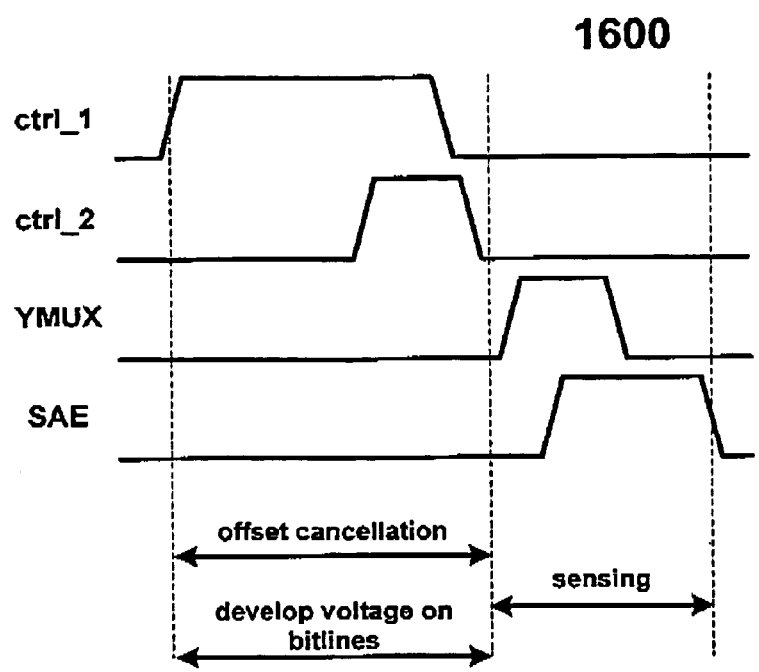
FIG. 16 shows a typical timing scheme associated with the proposed scheme shown in FIG. 15.

Offset cancellation stage is completed when ctrl_2 is makes a high level to low level transition turning off transistors M9 and M10, and turning on transistors M7 and M8. Next, the sense amplification stage begins the signal YMUX is enabled, turning on transistors M3 and M4. This connects the signals BL and BLB to the transistors M1 and M2. Next, SAE is enabled to the high level turning on transistor M11. Turning on transistor M11 activates the latch circuit in sense amplifier. The FIG. 16 illustrates the associate timing waveforms with the embodiment 1500.

The invention claimed is:

1. An offset cancelling sense amplifier configuration comprising:
   a latch comprising first and second latch node; and
   first and second bitlines; and
   first and second column multiplexor transistors; and
   said first and second latch nodes selectively coupled to said first and second bitlines via said first and second column multiplexor transistor; and
   column select timing signal; and
   gates of said first and second column multiplexor transistors selectively coupled to said column select timing signal; and
   one activation signal; and
   said latch activated by said activation signal; and
   first and second circuit configuration; and
   first and second control signal; and
   said first circuit configuration capable of discharging said first and second latch nodes and said first and second bitlines to ground voltage level; and
   said first circuit configuration enabled by first control signal; and
   said second circuit configuration capable of precharging said first and second latch nodes to VDD and said first and second bitlines to (VDD—threshold voltage) level, wherein threshold voltage is of said first and second column multiplexor transistor; and
   said second circuit configuration enabled by said second control signal, wherein said second circuit configuration is capable of compensating threshold mismatch of said column multiplexor transistors.

2. The sense amplifier of claim 1 wherein:
   said latch is capable of sensing voltage difference between said first and second bitlines.

3. The sense amplifier of claim 1 wherein:
   said latch is capable of sensing current difference between said first and second bitlines.

4. The sense amplifier of claim 1 wherein:
   said column select timing signal, said first and second control signals, and said activation signal are applied at different time intervals.

5. An offset cancelling sense amplifier configuration comprising:
   a latch comprising first and second latch node; and
   first and second bitlines; and
   first and second sensing transistors; and
   first and second column multiplexor transistors; and
   column select timing signal; and
   gates of said first and second column multiplexor transistors selectively coupled to said column select timing signal; and
   one activation signal; and
   said latch activated by said activation signal; and
   first and second circuit configuration; and
   first and second control signal; and
   gates of said first and second sensing transistors are selectively coupled to said first and second bitline via said first and second column multiplexor transistor; and
   sources of said sensing transistors are coupled to said first and second latching nodes; and
   drains of said sensing transistors are selectively coupled to VDD or around via said second circuit configuration; and
   said first circuit configuration capable of turning on said first and second sensing transistors; and
   said first circuit configuration enabled by said first control signal; and
   said second circuit configuration capable of precharging said first and second latch nodes to VDD or discharging said first and second latch nodes to (ground+threshold voltage) level depending on the voltage level of said second control signal, wherein threshold voltage is of said first and second sensing transistor; and
   said second circuit configuration enabled by said second control signal, wherein said second circuit configuration is capable of compensating threshold mismatch of said first and second sensing transistors.

6. The sense amplifier of claim 5 wherein:
   said latch is capable of sensing voltage difference between said first and second bitlines.

7. The sense amplifier of claim 5 wherein:
   said latch is capable of sensing current difference between said first and second bitlines.

8. The sense amplifier of claim 5 wherein:
   said column select timing signal, said first control signal, said second control signal, and said activation signals are applied at different time intervals.

9. An offset cancelling sense amplifier configuration comprising:
   a latch comprising first and second latch node and first and second sensing transistor; and
   first and second bitlines; and
   first and second column multiplexor transistors; and
   column select timing signal; and
   gates of said first and second column multiplexor transistors selectively coupled to said column select timing signal; and
   one activation signal; and
   said latch activated by said activation signal; and
   first and second circuit configuration; and
   first and second control signal; and gates of said first and second sensing transistors are selectively coupled to said first and second bitline via said first and second column multiplexor transistor; and sources of said sensing transistors are coupled to said first and second latching nodes; and drains of said sensing transistors are selectively coupled to ground or VDD via said second circuit configuration; and said first circuit configuration capable of turning on said first and second sensing transistors; and said first circuit configuration enabled by said first control signal; and said second circuit configuration capable of precharging said first and second latch nodes to (VDD—threshold voltage) level, wherein threshold voltage is of said sensing transistor; or discharging said first and second latch nodes to ground depending on the voltage level of said second control signal; and said second circuit configuration enabled by said second control signal, wherein said second circuit configuration is capable of compensating threshold mismatch of said first and second sensing transistors.

10. The sense amplifier of claim 9 wherein:
said latch is capable of sensing voltage difference between said first and second bitlines.

11. The sense amplifier of claim 9 wherein:
said latch is capable of sensing current difference between said first and second bitlines.

12. The sense amplifier of claim 9 wherein:
said column select timing signal, said first control signal, said second control signal, and said activation signals are applied at different time intervals.

13. A memory which implements the sense amplifier architecture of claim 1.

14. A memory which implements the sense amplifier architecture of claim 5.

15. A memory which implements the sense amplifier architecture of claim 9.

* * * * *